(12) United States Patent
Gonzalez

(10) Patent No.: US 9,786,329 B1
(45) Date of Patent: Oct. 10, 2017

(54) DIGITAL POSTCARD

(71) Applicant: Ailyn Margarita Gonzalez, Bronx, NY (US)

(72) Inventor: Ailyn Margarita Gonzalez, Bronx, NY (US)

( * ) Notice: Subject to any disclaimer, the term of this patent is extended or adjusted under 35 U.S.C. 154(b) by 0 days.

(21) Appl. No.: 15/258,592

(22) Filed: Sep. 7, 2016

Related U.S. Application Data

(63) Continuation-in-part of application No. 13/999,438, filed on Feb. 26, 2014, now abandoned.

(60) Provisional application No. 61/772,555, filed on Mar. 5, 2013.

(51) Int. Cl.
| | | |
|---|---|---|
| *G11B 33/06* | (2006.01) | |
| *H04N 5/907* | (2006.01) | |
| *H04N 5/765* | (2006.01) | |
| *G11B 33/02* | (2006.01) | |
| *H05K 5/00* | (2006.01) | |

(52) U.S. Cl.
CPC ............ *G11B 33/06* (2013.01); *G11B 33/025* (2013.01); *H04N 5/765* (2013.01); *H04N 5/907* (2013.01); *H05K 5/0086* (2013.01)

(58) Field of Classification Search
CPC ........... H04L 51/08; H04L 51/10; H04N 5/93; H04N 5/907; H05K 5/0086; G11B 33/025; G11B 33/06

USPC .......................................... 345/184; 386/230
See application file for complete search history.

(56) References Cited

U.S. PATENT DOCUMENTS

| | | | | |
|---|---|---|---|---|
| 2003/0011973 | A1* | 1/2003 | Jeong | G11B 25/043 361/679.06 |
| 2005/0129385 | A1* | 6/2005 | Speasl | H04N 5/907 386/230 |
| 2006/0134591 | A1* | 6/2006 | Karat | B42D 15/022 434/308 |
| 2007/0028496 | A1* | 2/2007 | Zizek | B42D 15/022 40/717 |
| 2007/0115202 | A1* | 5/2007 | Kiesenhofer | G06F 1/1616 345/1.1 |
| 2007/0169387 | A1* | 7/2007 | Glass | G09F 27/00 40/124.03 |
| 2010/0166189 | A1* | 7/2010 | Morohoshi | H04L 9/0822 380/284 |

* cited by examiner

*Primary Examiner* — Stephen Sherman

(57) ABSTRACT

Disclosed is an electronic digital postcard device comprising, a body housing a display, the housing defining a dimension of the device, where the dimension is at least one dimension of a postcard, and a port configured to receive an electronic media presentation, the electronic digital postcard being configured to store and playback a received electronic media presentation. Further, a method of delivering a digital postcard is disclosed.

8 Claims, 4 Drawing Sheets

DIGITAL POSTCARD

CROSS-REFERENCE TO RELATED APPLICATION

This U.S. non-provisional patent application is a continuation-in-part of co-pending U.S. non-provisional patent application Ser. No. 13/999,438, filed on Feb. 26, 2014, which in turn, claims the benefit of U.S. provisional patent application No. 61/772,555, filed on Mar. 5, 2013, all of which are incorporated-by-reference herein in their entireties.

FIELD OF THE INVENTION

This invention relates generally to a digital postcard and, more particularly, the invention relates to a digital postcard providing a postcard-sized electronic device for conveying digitally recorded best wishes to loved ones far away.

BACKGROUND OF THE INVENTION

While post cards do provide a cheap and effective way of communicating well wishes to loved ones back at home, they are rapidly being eclipsed by the pervasive nature of e-mail and other Internet technologies. A simple e-mail can contain and display many more images than a standard postcard ever could, and can also attach video clips, sound files and other multimedia elements that enrich the experience of receiving the message. Most standard post cards are limited to the single image on their front face, and so they offer the warmth and comfort of a physical connection with the sender, but lack the deeply personalizing details that a well-adorned e-mail can quickly communicate.

As such, there exists a need for a more entertaining postcard that presents digital data while maintaining physical intimacy provided by conventional postcards.

SUMMARY OF THE INVENTION

Disclosed is an electronic digital postcard device comprising, a body housing a display, the housing defining a dimension of the device, where the dimension is at least one dimension of a postcard, and a port configured to receive an electronic media presentation, the electronic digital postcard being configured to store and playback a received electronic media presentation.

In another aspect, the device is powered by button-cell batteries contained in a compartment on a rear side of the device.

In another aspect, the electronic media presentation includes digital audio.

In another aspect, the electronic media presentation includes images.

In another aspect, the electronic media presentation includes video.

In another aspect, the device further comprises a slide switch that turns on and off the device.

In another aspect, the display is protected by a thin sheet of transparent plastic.

In another aspect, playback of the electronic media presentation is controllable by physical buttons.

In another aspect, the port is a USB port.

In another aspect, the port is an SD port.

In another aspect, the device further comprises a speaker to playback audio of the presentation.

In another aspect, the body includes injection-molded surfaces.

In another aspect, the display is a Liquid Crystal Display.

In another embodiment, disclosed is a method of delivering an electronic postcard, the method comprising, providing an electronic postcard device to a user, the electronic postcard device including, a body housing a display, the housing defining a dimension of the device, where the dimension is at least one dimension of a postcard, and a port configured to receive an electronic media presentation, the electronic digital postcard being configured to store and playback a received electronic media presentation, creating a presentation for being delivered with the electronic postcard device to an intended recipient, uploading the presentation to the electronic postcard device, writing an address of the intended recipient on a package holding the the electronic postcard device, and sending the electronic postcard device via post.

These and other objects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, where like designations denote like elements, and in which.

Like reference numerals refer to like parts throughout the several views of the drawings.

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper", "lower", "left", "rear", "right", "front", "vertical", "horizontal", and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 1:
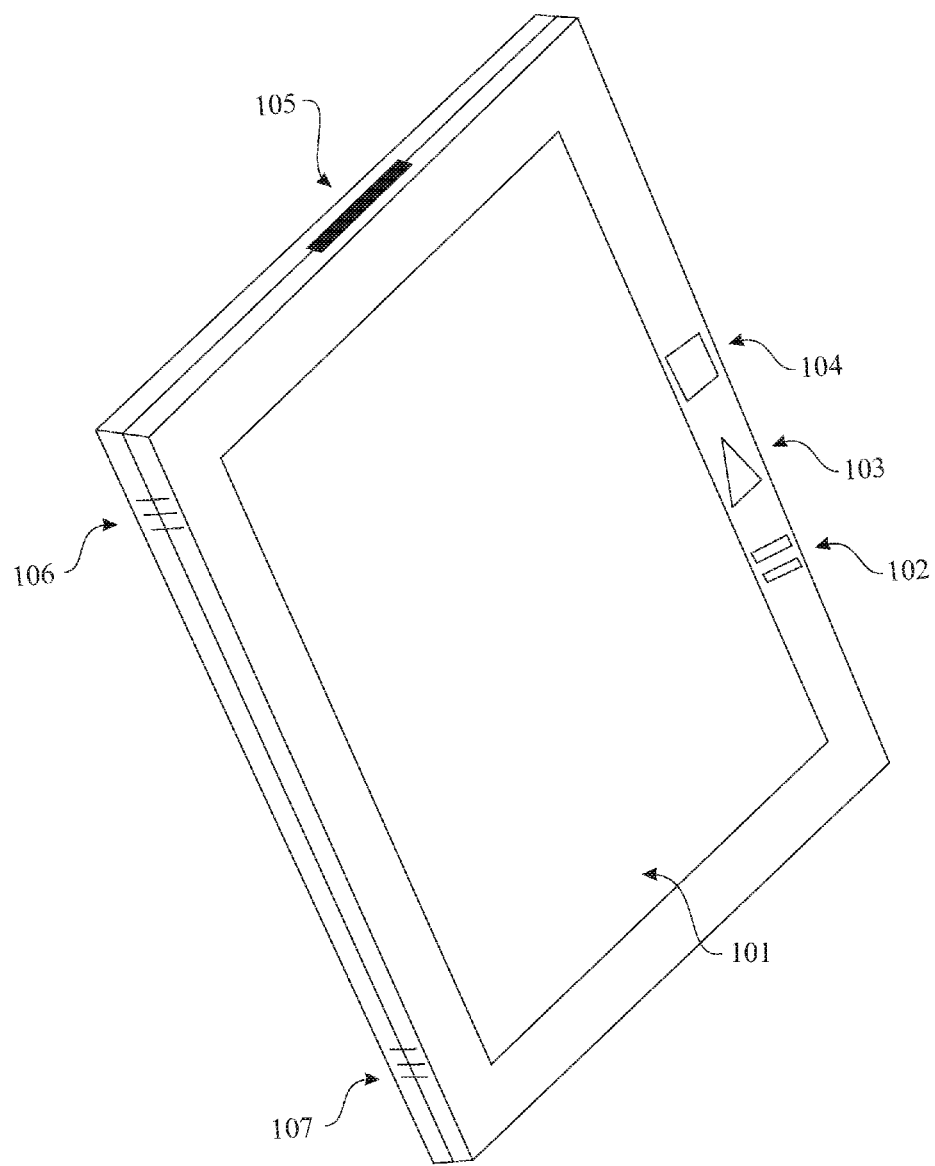
FIG. 1 shows a front perspective view of a digital postcard, in accordance with aspects of the present disclosure.
Figure 2:
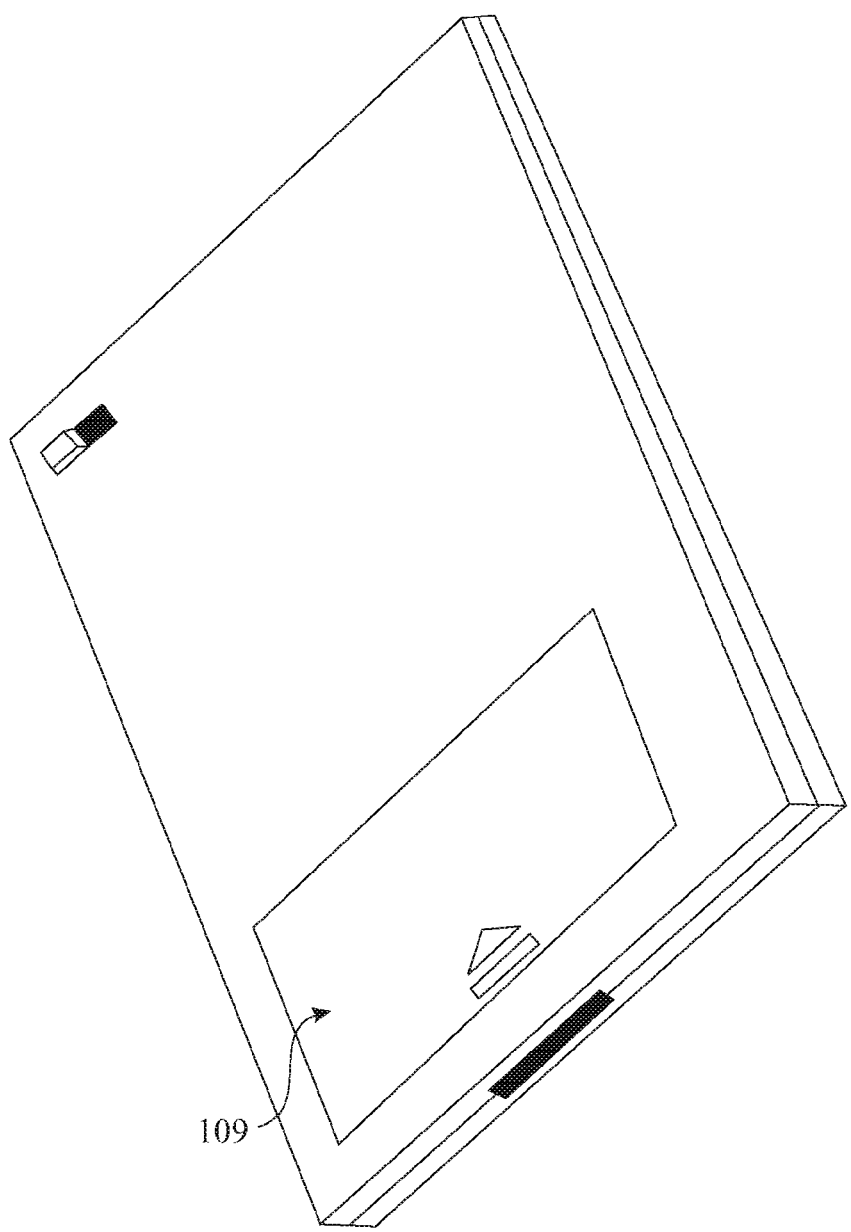
FIG. 2 shows a back perspective view of the digital postcard of FIG. 1, in accordance with aspects of the present disclosure.

As illustrated in FIGS. 1 and 2, the present invention is a digital postcard providing a postcard-sized electronic device for conveying digitally recorded best wishes to loved ones far away.

The digital postcard of the present invention replicates the dimensions of a regular post card. As such it is not only slim, but also light, rectangular and approximately pocket-sized. The postcard is available in two different embodiments, depending on what type of interface features the user requires to load the device with content. Both embodiments share similar dimensions, being 4¼ inches wide, 5¾ inches tall and ¼ inch deep. For example distal edges of the device may define these dimensions of the device. As such, the device has one or more dimensions that are similar to at least one dimension (e.g. of a face) a post card. For example, the device may have a length and width that matches a length and width of a typical post card. The front display face of each model sports a wide, full-color liquid crystal display, illuminated by a powerful light-emitting diode back-light. Beneath the display screen 101 are three control buttons for directing the operation of the device, specifically Pause 102, Play 103, and Stop 104 (FIG. 1). A plastic or rubber body or housing that houses the display.

The display screen 101 (FIG. 1) of the digital postcard of the present invention is protected by a thin sheet of transparent plastic, and the remainder of the body is housed in an injection-molded case having injection-molded surfaces, constructed of a similarly durable material. This helps protect the postcard from any rough treatment and handling it may undergo while traveling by post. The lower side of the device contains two small speakers (e.g. speakers 106 and 107 of FIG. 1) set in recessed depressions with tiny grilles. The speakers are wired to a media processor, providing an avenue for it to broadcast any audio accompanying the photo slide-show or video that's being displayed. The entire device is powered by a thin pair of button-cell batteries that are contained in a compartment 109 (FIG. 2) concealed behind a sliding panel that disconnects from the rear of the unit. Any appropriate power-providing element may be included such as a rechargeable battery and/or a solar power system.

The available media interfaces on the device depend on embodiments of the digital postcard. A first embodiment of the device has an SD card slot 105 (FIG. 1) on the right-hand side, into which cards containing media to be displayed may be securely fastened. A second embodiment, which is a slightly expanded embodiment of the same device, adds a mini USB port to the side of the device, and also some non-volatile on-board memory. The postcard offers users the opportunity to store content directly on the device, after delivering via either USB or SD card, eliminating the need to ship any SD card with the device. It is to be understood that the USB or SD cards may be generally referred to as storage devices.

The digital postcard of the present invention is designed to be used in any situation where one would like to send a postcard with benefits. These benefits include multiple digital picture attachments, an integrated slide-show soundtrack and even full-motion video with sound. The process begins with the purchase of the digital postcard. These can be for sale in tourist shops and other retail locations catering to the market of travelers. They can also conceivably be distributed by the post office itself, including the cost for shipping in the total purchase price.

Once the desired device has been secured, the user creates the presentation he or she wants to transmit or deliver with the postcard to the intended recipient. Directions packaged with the device direct the user to download specialized software from a specially configured web site, which allows for the creation of content specifically formatted for optimal performance on the device. With the software downloaded and installed, the correct and desired movies, images, and sound files can easily be bundled into a display-ready package. As soon as this package (electronic media presentation) is complete and edited to the user's satisfaction, it is ready for upload to the device. The package can be copied onto an SD card, and that SD card may be inserted into the slot on the device's side by pushing it all the way in to ensure that it secures itself properly. The name and address of the sender and recipient can be written in the correct locations on packaging or an envelope that holds or covers the device, and the entire ensemble (including the packaging) can be sent off via post. As such, once properly packaged to meet post-office standards and conventions, the device may be sent in the mail.

In the case of the second embodiment, the process is slightly different. As soon as the digital display package is ready, it can either be copied onto an SD card or copied directly onto the device via a mini USB cable. If an SD card is used, it can be removed again as soon as the device's display indicates that all its contents have been copied over to on-board memory. Once the correct content has been loaded on, the postcard is ready for addressing and posting. Upon receipt of either device, the recipient can activate the presentation and navigate through it using the three buttons on the bottom edge of the device. The digital postcard offers several distinct advantages over both regular postcards and emailed greetings from far away. The device makes it easy to share copious amounts of entertaining digital data, while at the same time maintaining the close physical intimacy associated with dispatching a real item through the post to a loved one. In this manner, the postcard provides a much better way to stay connected with friends and family while away, and include them in the special moments of your life's best days.

Figure 3:
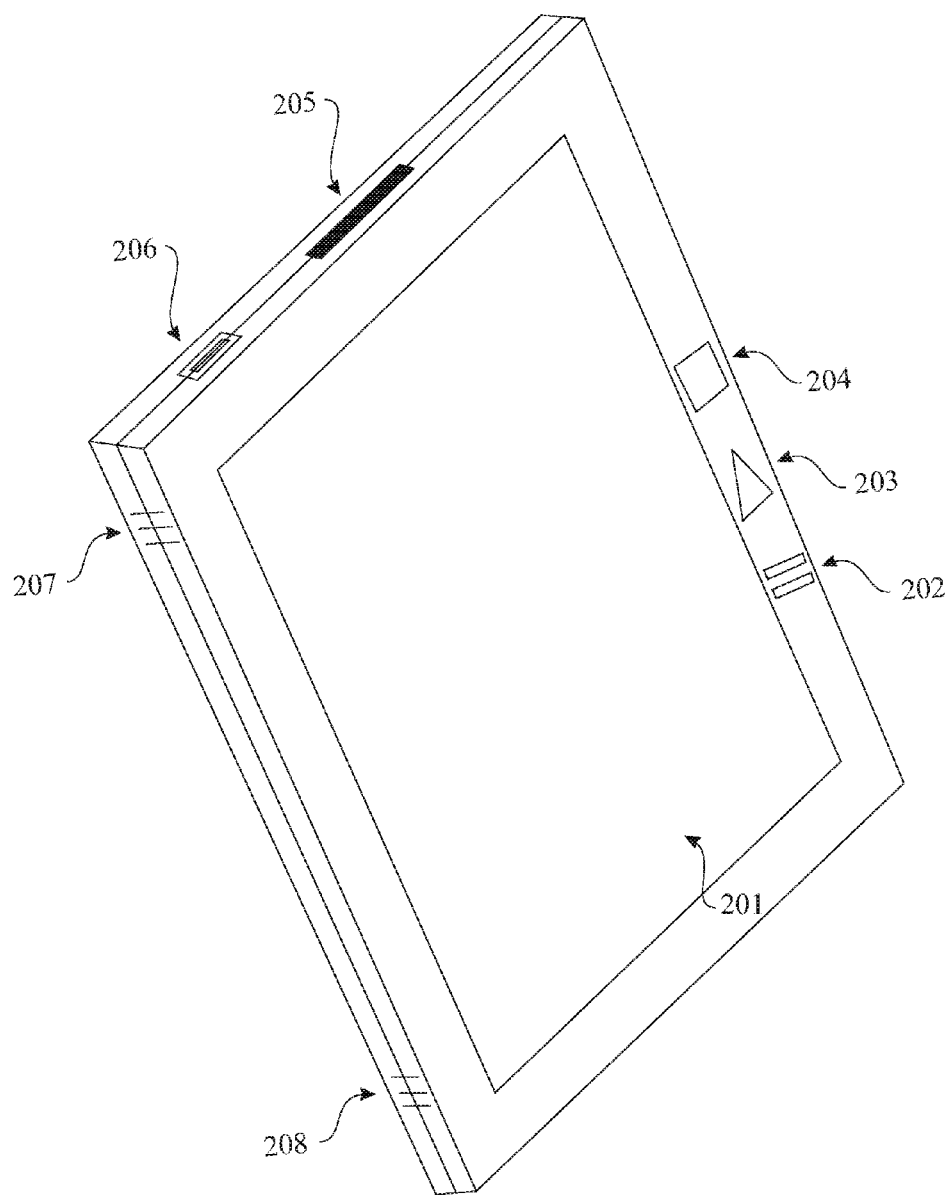
FIG. 3 shows a front perspective view of a second embodiment of a digital postcard, in accordance with aspects of the present disclosure.
Figure 4:
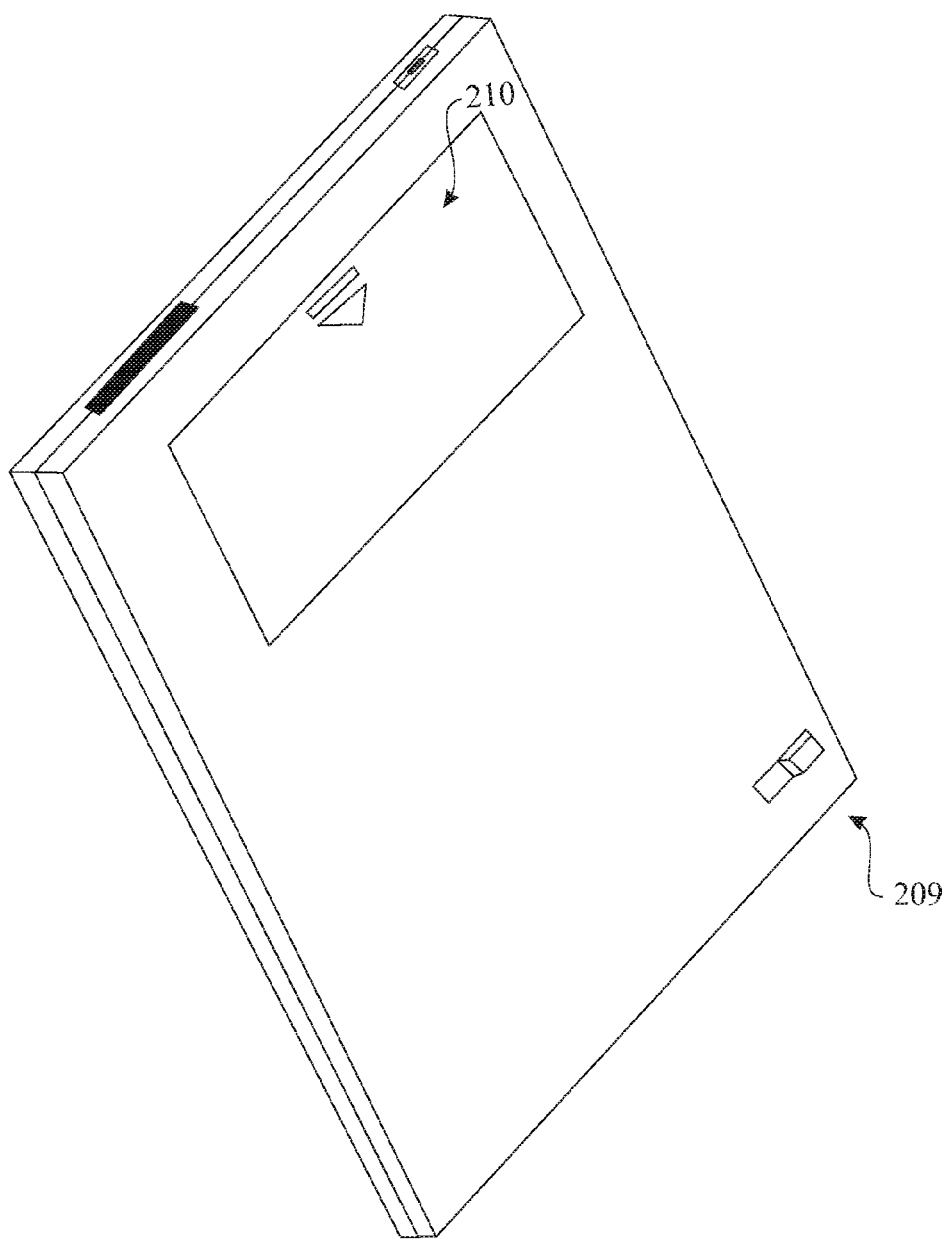
FIG. 4 shows a back perspective view of the second embodiment of the digital postcard, in accordance with aspects of the present disclosure.

The illustrations of FIGS. 2 and 3 show the second embodiment including the above features (e.g. a display 201, pause button 202, play button 203, stop button 204, SD card port 205, speakers 207 and 208, and compartment 210) further including a USB port 206 and a sliding power switch 209. It is to be understood that one or a combination of the elements in FIGS. 1-4 may be included in any embodiment disclosed herein. For example, a sliding power switch may be included in the embodiment of FIG. 2.

Therefore, in one example, the device may include, a single panel electronic postcard body, a digital media player having a 4¼ inch display screen within a single panel electronic postcard body, where the electronic digital postcard device operates to store and playback one or more digital data files and one or more audio files, where the digital postcard device is housed with a slide on/off switch and contains three buttons on a bottom front of the device, which is operative to initiate playback of at least one digital data file, the device further including, a USB port contained within the electronic digital postcard device electronically connected to the digital media player, and an SD card reader port, which allows for an SD card to move between a first position wherein it is contained in the electronic device and a second position outside the SD card reader port, and wherein the SD card reader port is electronically connected to the digital media player. The device may be powered by button-cell batteries contained in a compartment on the rear side of the device. The one or more data files may include digital audio files. The one or more digital data files may include images and photographs. The one or more digital data files may include a video data file. The switch may be a slide switch that turns on and off the device. The display screen may be protected by a thin sheet of transparent plastic. The buttons may be press-buttons. The device may include a USB port. The device may include an SD port. The device may further comprise, two speakers set in recessed depressions behind grilles. The electronic postcard body may be housed in an injection-molded case. The display screen may be a Liquid Crystal Display.

The foregoing exemplary descriptions and the illustrative preferred embodiments of the present invention have been explained in the drawings and described in detail, with varying modifications and alternative embodiments being taught. While the invention has been so shown, described, and illustrated, it should be understood by those skilled in the art that equivalent changes in form and detail may be made therein without departing from the true spirit and scope of the invention, and that the scope of the present invention is to be limited only to the claims except as precluded by the prior art. Moreover, the invention as disclosed herein may be suitably practiced in the absence of specific elements which are disclosed herein.

Since many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalents.

What is claimed is:

1. An electronic digital postcard device comprising:
a display screen, three physical buttons on the bottom front of the device, a USB port, a SD card reader, speakers, on/off switch, powered by button cell batteries, and housed within a two injection molded case, wherein the electronic digital postcard device is solely dedicated to displaying photo images and video.

2. The electronic digital postcard of claim 1, wherein the device screen is a liquid crystal display protected by a thin sheet of transparent plastic.

3. The electronic digital postcard device of claim 1, wherein the three physical buttons comprise play, pause, and stop, which are to be pressed on buttons.

4. The electronic digital postcard device of claim 1, wherein the USB Port allows for digital data files such as images photographs, video and audio files to be stored and played back within the digital device.

5. The electronic digital postcard device of claim 1, wherein the device includes a SD card reader port, which moves between a first position wherein its contained with the electronic postcard device and a second position wherein it exists the SD card reader, the port is electronically connected to the digital device, which also allows for data files such as images, photographs, video and audio files to be stored and played back within the digital device.

6. The electronic digital postcard of claim 1, wherein the speakers comprise of two speakers set in recessed depressions with tiny grilles.

7. The electronic digital postcard device of claim 1, where in the on/off switch is a slide switch that turns on and off the device.

8. The electronic digital postcard device of claim 1, wherein the device is powered by the button-cell batteries contained in a compartment on the back of the device.

\* \* \* \* \*